US012736876B2

(12) United States Patent
Park et al.

(10) Patent No.: US 12,736,876 B2
(45) Date of Patent: Sep. 15, 2026

(54) COMPOUND, BINDER RESIN, NEGATIVE-TYPE PHOTOSENSITIVE RESIN COMPOSITION, AND DISPLAY DEVICE COMPRISING BLACK BANK FORMED USING SAME

(71) Applicant: LG CHEM, LTD., Seoul (KR)

(72) Inventors: Sumin Park, Daejeon (KR); Won Jung Lee, Daejeon (KR); Minyoung Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 1169 days.

(21) Appl. No.: 17/769,477

(22) PCT Filed: Dec. 17, 2020

(86) PCT No.: PCT/KR2020/018517

§ 371 (c)(1),
(2) Date: Apr. 15, 2022

(87) PCT Pub. No.: WO2021/125821

PCT Pub. Date: Jun. 24, 2021

(65) Prior Publication Data

US 2023/0236504 A1 Jul. 27, 2023

(30) Foreign Application Priority Data

Dec. 17, 2019 (KR) ........................ 10-2019-0168758

(51) Int. Cl.
*G03F 7/035* (2006.01)
*C08G 18/32* (2006.01)
(Continued)

(52) U.S. Cl.
CPC ......... *G03F 7/035* (2013.01); *C08G 18/3206* (2013.01); *C08G 18/348* (2013.01);
(Continued)

(58) Field of Classification Search
CPC ..... G03F 7/035; G03F 7/027; C08G 18/3215; C08G 18/3206; C08G 18/7671; C08G 18/7685; C08G 18/348
See application file for complete search history.

(56) References Cited

U.S. PATENT DOCUMENTS 10,633,486 B2 4/2020 Kim et al.
11,130,838 B2 9/2021 Lee et al.
(Continued)

FOREIGN PATENT DOCUMENTS

JP 2006-327990 A 12/2006
JP 2017-146376 A 8/2017
(Continued)

OTHER PUBLICATIONS

International Search Report and Written Opinion issued for International Application No. PCT/KR2020/018517, on Apr. 13, 2021, 12 pages.

*Primary Examiner* — John S. Chu
(74) *Attorney, Agent, or Firm* — ROTHWELL, FIGG, ERNST & MANBECK, P.C.

(57) ABSTRACT

The present application relates to a compound of Chemical Formula 1, a binder resin, a negative-type photosensitive resin composition, and a display apparatus including a black bank formed using the same.

13 Claims, 2 Drawing Sheets

(51) Int. Cl.

| | |
|---|---|
| ***C08G 18/34*** | (2006.01) |
| ***C08G 18/67*** | (2006.01) |
| ***C08G 18/76*** | (2006.01) |
| ***G03F 7/027*** | (2006.01) |
| ***G03F 7/029*** | (2006.01) |
| ***G03F 7/038*** | (2006.01) |
| *G03F 7/16* | (2006.01) |
| *G03F 7/32* | (2006.01) |
| *G03F 7/40* | (2006.01) |

(52) U.S. Cl.
CPC ....... *C08G 18/675* (2013.01); *C08G 18/7671* (2013.01); *C08G 18/7685* (2013.01); *G03F 7/027* (2013.01); *G03F 7/0295* (2013.01); *G03F 7/0382* (2013.01); *G03F 7/162* (2013.01); *G03F 7/322* (2013.01); *G03F 7/40* (2013.01)

(56) References Cited

U.S. PATENT DOCUMENTS

| | | | | |
|---|---|---|---|---|
| 2006/0166114 | A1* | 7/2006 | Lee | G03F 7/0047 430/7 |
| 2010/0136491 | A1* | 6/2010 | Matsumoto | C07D 209/88 522/39 |
| 2011/0151379 | A1 | 6/2011 | Choi et al. | |
| 2013/0189623 | A1 | 7/2013 | Kim et al. | |
| 2016/0377977 | A1* | 12/2016 | Tanaka | G02B 5/201 359/891 |
| 2018/0180995 | A1 | 6/2018 | Choi et al. | |
| 2018/0356729 | A1* | 12/2018 | Tanigaki | G03F 7/0007 |
| 2018/0368253 | A1* | 12/2018 | Ooga | H05K 3/28 |

FOREIGN PATENT DOCUMENTS

| | | | | |
|---|---|---|---|---|
| KR | 10-2007-0070472 | A | 7/2007 | |
| KR | 10-2011-0071965 | A | 6/2011 | |
| KR | 10-2012-0007453 | A | 1/2012 | |
| KR | 10-2012-0033893 | A | 4/2012 | |
| KR | 2015-0144105 | A | 6/2014 | |
| KR | 20160084894 | A * | 7/2016 | G03F 7/0045 |
| KR | 10-2017-0045659 | A | 4/2017 | |
| KR | 10-2018-0073611 | A | 7/2018 | |
| TW | 201840640 | A | 11/2018 | |
| TW | 201943823 | A | 11/2019 | |
| WO | 2014-199967 | A1 | 12/2014 | |
| WO | WO-2019022169 | A1 * | 1/2019 | G03F 7/027 |

* cited by examiner

【FIG. 1】
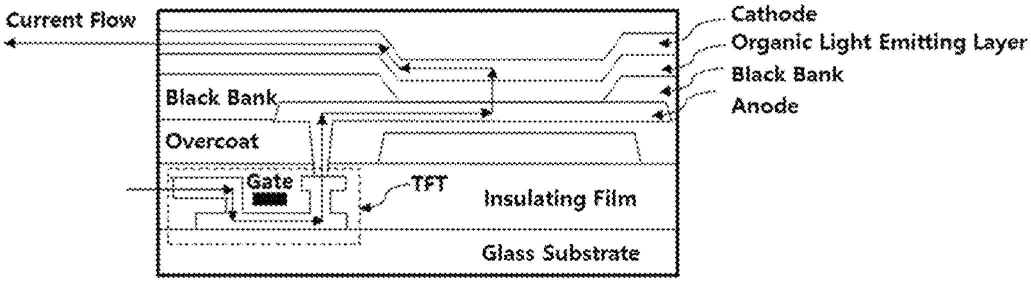
【FIG. 2】
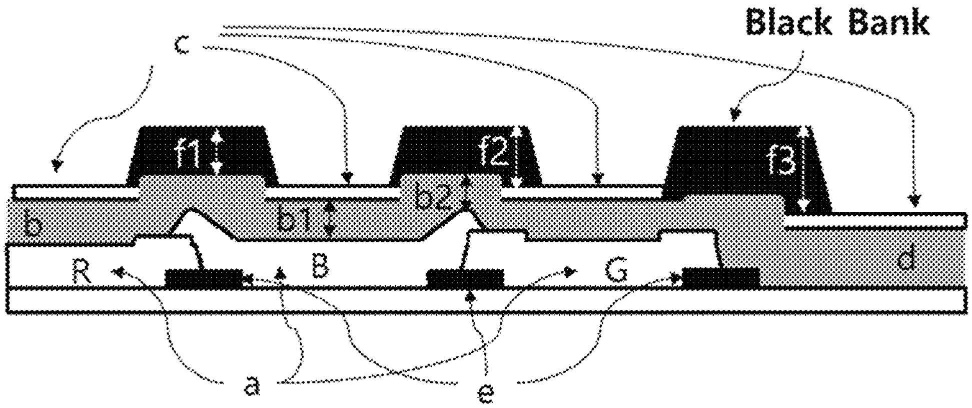

【FIG. 3】
| | Developing Time | SEM | | Developing Time | SEM |
|---|---|---|---|---|---|
| Example 1 | 110s | 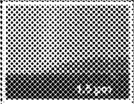 | Example 2 | 70s | 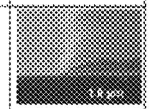 |
| | 130s | 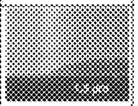 | | 90s | 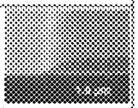 |
| Comparative Example 1 | 70s |  | Comparative Example 2 | 50s | 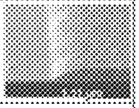 |
| | 90s | 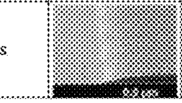 | | 70s | Pattern Lost |
| | Developing Time | SEM |
|---|---|---|
| Example 3 | 100s | 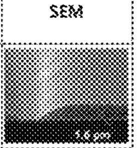 |
| | 120s | 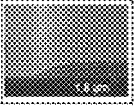 |

COMPOUND, BINDER RESIN, NEGATIVE-TYPE PHOTOSENSITIVE RESIN COMPOSITION, AND DISPLAY DEVICE COMPRISING BLACK BANK FORMED USING SAME

This application is a 35 U.S.C. 371 National Phase Entry Application from PCT/KR2020/018517, filed on Dec. 17, 2020, which claims priority to and the benefits of Korean Patent Application No. 10-2019-0168758, filed with the Korean Intellectual Property Office on Dec. 17, 2019, the entire contents of which are incorporated herein by reference.

TECHNICAL FIELD

The present application relates to a compound, a binder resin, a negative-type photosensitive resin composition, and a display apparatus including a black bank formed using the same.

BACKGROUND OF THE INVENTION

A transparent bank used as an insulating layer in an organic light emitting device display (OLED display) needs to use a polarizing plate in order to reduce external light reflection. However, using a polarizing plate has a disadvantage of reducing luminance. When applying a black bank using a black pigment instead of an existing transparent bank insulating film, external light reflection is reduced providing possibility of obtaining a display without a polarizing plate, and by reducing a decrease in the luminance caused by a polarizing plate, luminance of two times or higher than the present may be obtained.

When obtaining a pattern of a black bank, using an existing linear cardo-based binder results in problems such as declined film properties and pattern loss when increasing a developing time.

Accordingly, studies for improving linearity and margin when obtaining a pattern of a black bank have been required in the art.

BRIEF SUMMARY OF THE INVENTION

The present application is directed to providing a compound having excellent linearity and compatibility for a pigment dispersion, a binder resin, a negative-type photosensitive resin composition, and a display apparatus including a black bank formed using the same.

One embodiment of the present specification provides a compound of the following Chemical Formula 1.

[Chemical Formula 1]

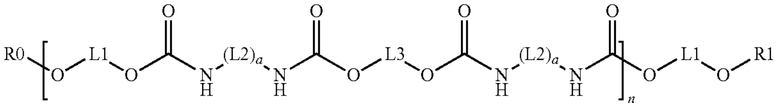

In Chemical Formula 1,

R0 and R1 are the same as or different from each other, and each independently hydrogen; or —(C═O)R', R' is a substituted or unsubstituted aryl group, L2 is a substituted or unsubstituted alkylene group; a substituted or unsubstituted cycloalkylene group; or a substituted or unsubstituted arylene group, a is 2 or 3, n is an integer of 1 to 10, and L1 and L3 are the same as or different from each other, and each independently include at least one of linking groups of the following Chemical Formulae 2 and 4,

[Chemical Formula 2]

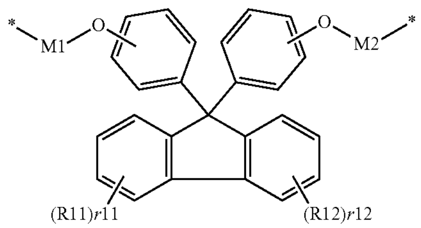

[Chemical Formula 4]

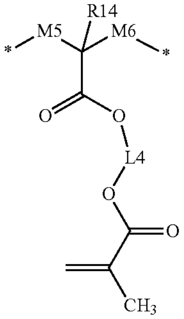

in Chemical Formulae 2 and 4, means a part linked to Chemical Formula 1,

M1, M2, M5, M6 and L4 are the same as or different from each other, and each independently a substituted or unsubstituted alkylene group, R11, R12 and R14 are the same as or different from each other, and each independently hydrogen; or a substituted or unsubstituted alkyl group, and r11 and r12 are each an integer of 0 to 4, and when r11 is 2 or greater, R11s are the same as or different from each other, and when r12 is 2 or greater, R12s are the same as or different from each other.

One embodiment of the present specification provides a binder resin including the compound.

One embodiment of the present specification provides a negative-type photosensitive resin composition including the binder resin; a pigment dispersion: a multifunctional monomer; a photoinitiator; and a solvent.

One embodiment of the present specification provides a black bank formed using the negative-type photosensitive resin composition.

One embodiment of the present specification provides a display apparatus including the black bank.

Advantageous Effects

A compound according to the present specification, a binder resin including the same, and a negative-type photosensitive resin composition including the binder resin have excellent development resistance, and can enhance film properties by having high crosslinking properties.

BRIEF DESCRIPTION OF DRAWINGS

FIG. 1 is a mimetic diagram of a display apparatus including a black bank according to one embodiment of the present application.

FIG. 2 is a mimetic diagram illustrating a thickness of a coated film formed using a negative-type photosensitive resin composition according to one embodiment of the present application.

FIG. 3 shows scanning electron microscope (SEM) images of a coated film formed using each of negative-type photosensitive resin compositions according to examples and comparative examples.

DETAILED DESCRIPTION OF THE INVENTION

In the present specification, a description of one member being placed "on" another member includes not only a case of the one member being in contact with the another member but a case of still another member being present between the two members.

In the present specification, a description of a certain part "including" certain constituents means capable of further including other constituents, and does not exclude other constituents unless particularly stated on the contrary.

One embodiment of the present specification provides a compound of the following Chemical Formula 1.

[Chemical Formula 1]

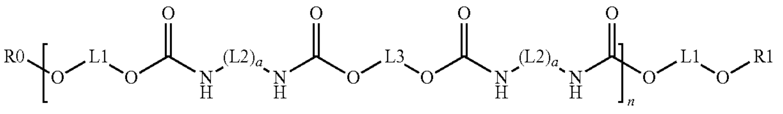

In Chemical Formula 1,

R0 and R1 are the same as or different from each other, and each independently hydrogen; or —(C═O)R', R' is a substituted or unsubstituted aryl group, L2 is a substituted or unsubstituted alkylene group; a substituted or unsubstituted cycloalkylene group; or a substituted or unsubstituted arylene group, a is 2 or 3, n is an integer of 1 to 10, and L1 and L3 are the same as or different from each other, and each independently include at least one of linking groups of the following Chemical Formulae 2 and 4,

[Chemical Formula 2]

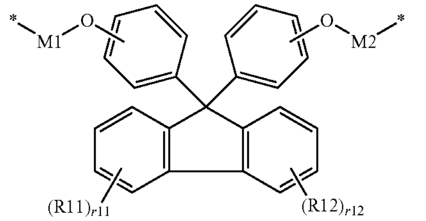

[Chemical Formula 4]

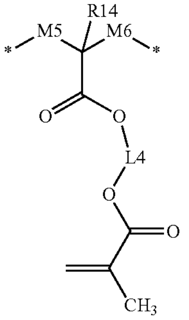

in Chemical Formulae 2 and 4,

*— means a part linked to Chemical Formula 1,

M1, M2, M5, M6 and L4 are the same as or different from each other, and each independently a substituted or unsubstituted alkylene group, R11, R12 and R14 are the same as or different from each other, and each independently hydrogen; or a substituted or unsubstituted alkyl group, and r11 and r12 are each an integer of 0 to 4, and when r11 is 2 or greater, R11s are the same as or different from each other, and when r12 is 2 or greater, R12s are the same as or different from each other.

By including the compound of Chemical Formula 1 in a binder resin and adding the binder resin to a negative-type photosensitive resin composition, development resistance is improved compared to existing cardo-based binder resins, and film properties are enhanced by increasing crosslinking properties.

A steric structure is obtained by the compound of Chemical Formula 1 having a urethane functional group, and as a result, development resistance may be improved.

In the present specification,

*— means a site bonding to other substituents or bonding sites.

In the present specification, examples of substituents are described below, however, the substituents are not limited thereto.

In the present specification, the term "substituted or unsubstituted" means being substituted with one or more substituents selected from the group consisting of deuterium; a halogen group; a nitrile group; a nitro group; —OH; —COOH; an alkyl group; a cycloalkyl group; an alkenyl group; a cycloalkenyl group; and an aryl group, or having no substituents.

In the present specification, the alkyl group may be linear or branched, and although not particularly limited thereto, the number of carbon atoms of the alkyl group may be from 1 to 30. According to another embodiment, the number of carbon atoms of the alkyl group is from 1 to 20. According to another embodiment, the number of carbon atoms of the alkyl group is from 1 to 10. Specific examples of the alkyl group may include a methyl group, an ethyl group, an n-propyl group, an isopropyl group, an n-butyl group, an isobutyl group, a tert-butyl group, an n-pentyl group, an n-hexyl group, an n-heptyl group, an n-octyl group and the like, but are not limited thereto.

In the present specification, the cycloalkyl group is not particularly limited, however, according to one embodiment, the number of carbon atoms of the cycloalkyl group is from 3 to 30. According to another embodiment, the number of carbon atoms of the cycloalkyl group is from 3 to 20. According to another embodiment, the number of carbon atoms of the cycloalkyl group is from 3 to 10. Specific examples thereof may include a cyclopropyl group, a cyclobutyl group, a cyclopentyl group, a cyclohexyl group, a cycloheptyl group, a cyclooctyl group and the like, but are not limited thereto.

In the present specification, the alkenyl group may be linear or branched, and although not particularly limited thereto, the number of carbon atoms of the alkenyl group is from 2 to 30 according to one embodiment. According to another embodiment, the number of carbon atoms of the alkenyl group is from 2 to 20. According to another embodiment, the number of carbon atoms of the alkenyl group is from 2 to 10. Specific examples of the alkenyl group may preferably include an aryl group-substituted alkenyl group such as a stilbenyl group and a styrenyl group, but are not limited thereto.

In the present specification, the cycloalkenyl group is not particularly limited, however, according to one embodiment, the number of carbon atoms of the cycloalkenyl group is from 3 to 30. According to another embodiment, the number of carbon atoms of the cycloalkenyl group is from 3 to 20. According to another embodiment, the number of carbon atoms of the cycloalkenyl group is from 3 to 10. Examples of the cycloalkenyl group preferably include a cyclopentenylene group and a cyclohexenylene group, but are not limited thereto.

In the present specification, the alkylene group means having two bonding positions in the alkane. The alkylene group may be linear, branched or cyclic. Although not particularly limited thereto, the number of carbon atoms of the alkylene group may be, for example, from 1 to 30. In addition, the number of carbon atoms may be from 1 to 20, or from 1 to 10.

In the present specification, the aryl group is not particularly limited, but may be a monocyclic aryl group or a polycyclic aryl group. According to one embodiment, the number of carbon atoms of the aryl group is from 6 to 30. According to one embodiment, the number of carbon atoms of the aryl group is from 6 to 20. When the aryl group is a monocyclic aryl group, examples thereof may include a phenyl group, a biphenyl group, a terphenyl group and the like, but are not limited thereto. When the aryl group is a polycyclic aryl group, examples thereof may include a naphthyl group, an anthracenyl group, an indenyl group, a phenanthrenyl group, a pyrenyl group, a perylenyl group, a triphenyl group, a chrysenyl group, a fluorenyl group and the like, but are not limited thereto.

In the present specification, the arylene group means having two bonding positions in the aryl group.

In the present specification, the cycloalkenylene group means having two bonding positions in the cycloalkenyl group.

In one embodiment of the present specification, L2 is a substituted or unsubstituted alkylene group; a substituted or unsubstituted cycloalkylene group; or a substituted or unsubstituted arylene group.

In one embodiment of the present specification, L2 is a substituted or unsubstituted alkylene group having 1 to 30 carbon atoms; a substituted or unsubstituted cycloalkylene group having 3 to 30 carbon atoms; or a substituted or unsubstituted arylene group having 6 to 30 carbon atoms.

In one embodiment of the present specification, L2 is a substituted or unsubstituted alkylene group having 1 to 20 carbon atoms; a substituted or unsubstituted cycloalkylene group having 3 to 20 carbon atoms; or a substituted or unsubstituted arylene group having 6 to 20 carbon atoms.

In one embodiment of the present specification, L2 is a substituted or unsubstituted alkylene group having 1 to 10 carbon atoms; a substituted or unsubstituted cycloalkylene group having 3 to 10 carbon atoms; or a substituted or unsubstituted arylene group having 6 to 12 carbon atoms.

In one embodiment of the present specification, L2 is a substituted or unsubstituted methylene group; a substituted or unsubstituted cyclohexylene group; or a substituted or unsubstituted phenylene group.

In one embodiment of the present specification, L2 is a methylene group; a cyclohexylene group substituted with a methyl group; or a phenylene group.

In one embodiment of the present specification, a is 2 or 3.

In one embodiment of the present specification, L1 and L3 are the same as or different from each other, and each independently include at least one of the linking groups of Chemical Formulae 2 to 4.

The "including at least one of the linking groups of Chemical Formulae 2 and 4" may mean including both the linking group of Chemical Formula 2 and the linking group of Chemical Formula 4, may mean including only the linking group of Chemical Formula 2, or may mean including only the linking group of Chemical Formula 4.

In one embodiment of the present specification, L1 includes the linking group of Chemical Formula 2, and L3 may include the linking group of Chemical Formula 4.

In one embodiment of the present specification, L1 is the linking group of Chemical Formula 2, and L3 may be the linking group of Chemical Formula 4.

In one embodiment of the present specification, R0 and R1 are the same as or different from each other, and each independently hydrogen; or —(C═O)R'.

In one embodiment of the present specification, R0 and R1 are hydrogen.

In one embodiment of the present specification, R0 and R1 are each —(C═O)R'.

In one embodiment of the present specification, R' is a substituted or unsubstituted aryl group having 6 to 30 carbon atoms.

In one embodiment of the present specification, R' is a substituted or unsubstituted aryl group having 6 to 20 carbon atoms.

In one embodiment of the present specification, R' is a substituted or unsubstituted aryl group having 6 to 12 carbon atoms.

In one embodiment of the present specification, R' is a substituted or unsubstituted phenyl group.

In one embodiment of the present specification, R' is a phenyl group substituted with a hydroxyl group.

In one embodiment of the present specification, R' is a phenyl group substituted with a carboxyl group.

In one embodiment of the present specification, R' is phenyl group substituted with two carboxyl groups.

In one embodiment of the present specification, L1 and L3 each include both the linking groups of Chemical Formulae 2 and 4.

In one embodiment of the present specification, L1 includes both the linking groups of Chemical Formulae 2 and 4.

In one embodiment of the present specification, L3 includes both the linking groups of Chemical Formulae 2 and 4.

In one embodiment of the present specification, when L1 and L3 each include the linking groups of Chemical Formulae 2 and 4, the order of the linking groups is not particularly limited.

In one embodiment of the present specification, M1, M2, M5, M6 and L4 are the same as or different from each other, and each independently a substituted or unsubstituted alkylene group.

In one embodiment of the present specification, M1, M2, M5, M6 and L4 are the same as or different from each other, and each independently a substituted or unsubstituted alkylene group having 1 to 30 carbon atoms.

In one embodiment of the present specification, M1, M2, M5, M6 and L4 are the same as or different from each other, and each independently a substituted or unsubstituted alkylene group having 1 to 20 carbon atoms.

In one embodiment of the present specification, M1, M2, M5, M6 and L4 are the same as or different from each other, and each independently a substituted or unsubstituted alkylene group having 1 to 10 carbon atoms.

In one embodiment of the present specification, M1, M2, M5, M6 and L4 are the same as or different from each other, and each independently a substituted or unsubstituted methylene group; or a substituted or unsubstituted ethylene group.

In one embodiment of the present specification, M1, M2, M5, M6 and L4 are the same as or different from each other, and each independently a methylene group; or an ethylene group.

In one embodiment of the present specification, M1, M2, M5 and M6 are the same as or different from each other, and each independently a substituted or unsubstituted methylene group.

In one embodiment of the present specification, L4 is a propylene group substituted with a hydroxyl group.

In one embodiment of the present specification, M1 and M2 are an ethylene group.

In one embodiment of the present specification, M5 and M6 are a methylene group.

In one embodiment of the present specification, R11, R12 and R14 are the same as or different from each other, and each independently hydrogen; or a substituted or unsubstituted alkyl group.

In one embodiment of the present specification, R11, R12 and R14 are the same as or different from each other, and each independently hydrogen; or a substituted or unsubstituted alkyl group having 1 to 30 carbon atoms.

In one embodiment of the present specification, R11, R12 and R14 are the same as or different from each other, and each independently hydrogen; or a substituted or unsubstituted alkyl group having 1 to 20 carbon atoms.

In one embodiment of the present specification, R11, R12 and R14 are the same as or different from each other, and each independently hydrogen; or a substituted or unsubstituted alkyl group having 1 to 10 carbon atoms.

In one embodiment of the present specification, R11, R12 and R14 are the same as or different from each other, and each independently hydrogen; or a substituted or unsubstituted methyl group.

In one embodiment of the present specification, R11 and R12 are hydrogen.

In one embodiment of the present specification, R14 is a methyl group.

In one embodiment of the present specification, r11 and r12 are each an integer of 0 to 4, and when r11 is 2 or greater, R11s are the same as or different from each other, and when r12 is 2 or greater, R12s are the same as or different from each other.

In one embodiment of the present specification, (L2)a is the following Chemical Formula 5 or 6.

[Chemical Formula 5)

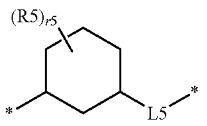

[Chemical Formula 6]

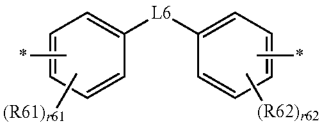

In Chemical Formulae 5 and 6, means a part linked to Chemical Formula 1,

- L5 and L6 are the same as or different from each other, and each independently a substituted or unsubstituted alkylene group,
- R5, R61 and R62 are the same as or different from each other, and each independently hydrogen; or a substituted or unsubstituted alkyl group,
- r5 is an integer of 0 to 10, and when r5 is 2 or greater, R5s are the same as or different from each other,
- r61 is an integer of 0 to 4, and when r61 is 2 or greater, R61s are the same as or different from each other, and
- r62 is an integer of 0 to 4, and when r62 is 2 or greater, R62s are the same as or different from each other.

In one embodiment of the present specification, L5 and L6 are the same as or different from each other, and each independently a substituted or unsubstituted alkylene group having 1 to 30 carbon atoms.

In one embodiment of the present specification, L5 and L6 are the same as or different from each other, and each independently a substituted or unsubstituted alkylene group having 1 to 20 carbon atoms.

In one embodiment of the present specification, L5 and L6 are the same as or different from each other, and each independently a substituted or unsubstituted alkylene group having 1 to 10 carbon atoms.

In one embodiment of the present specification, L5 and L6 are the same as or different from each other, and each independently a substituted or unsubstituted methylene group.

In one embodiment of the present specification, L5 and L6 are the same as or different from each other, and each independently a methylene group.

In one embodiment of the present specification, R5, R61 and R62 are the same as or different from each other, and each independently hydrogen; or a substituted or unsubstituted alkyl group having 1 to 30 carbon atoms.

In one embodiment of the present specification, R5, R61 and R62 are the same as or different from each other, and each independently hydrogen; or a substituted or unsubstituted alkyl group having 1 to 20 carbon atoms.

In one embodiment of the present specification, R5, R61 and R62 are the same as or different from each other, and each independently hydrogen; or a substituted or unsubstituted alkyl group having 1 to 10 carbon atoms.

In one embodiment of the present specification, R5, R61 and R62 are the same as or different from each other, and each independently hydrogen; or a substituted or unsubstituted methyl group.

In one embodiment of the present specification, R5 is hydrogen; or a methyl group.

In one embodiment of the present specification, R61 and R62 are hydrogen.

In one embodiment of the present specification, Chemical Formula 1 may be any one of the following chemical formulae, but is not limited thereto.

In the chemical formulae, n is an integer of 1 to 10.

In one embodiment of the present specification, the binder resin has a weight average molecular weight of 2,000 g/mol to 10,000 g/mol. The weight average molecular weight is preferably from 2,000 g/mol to 5,000 g/mol.

One embodiment of the present specification provides a binder resin including the compound.

In one embodiment of the present specification, the binder resin may include an additional binder resin together with the compound, or may be formed only with the compound. Herein, the additional binder resin is not particularly limited, and those used in the art may be employed.

One embodiment of the present specification provides a negative-type photosensitive resin composition including the binder resin described above; a pigment dispersion: a multifunctional monomer; a photoinitiator; and a solvent.

In one embodiment of the present specification, multifunctional monomers having an ethylenically unsaturated double bond may be used as the multifunctional monomer.

In one embodiment of the present specification, examples of the multifunctional monomer having an ethylenically unsaturated double bond may include a compound having at least one, or two or more addition-polymerizable unsaturated groups in the molecule and having a boiling point of 100° C. or higher, a caprolactone-introduced multifunctional monomer, or the like.

In one embodiment of the present specification, nonlimiting examples of the compound having at least one, or two or more addition-polymerizable unsaturated groups in the molecule and having a boiling point of 100° C. or higher may include a multifunctional monomer such as polyethylene glycol mono(meth)acrylate, polypropylene glycol mono (meth)acrylate or phenoxyethyl (meth)acrylate, a multifunctional monomer such as polyethylene glycol (meth)acrylate, polypropylene glycol (meth)acrylate, trimethylolethane triacrylate, trimethylolpropane triacrylate, neopentyl glycol

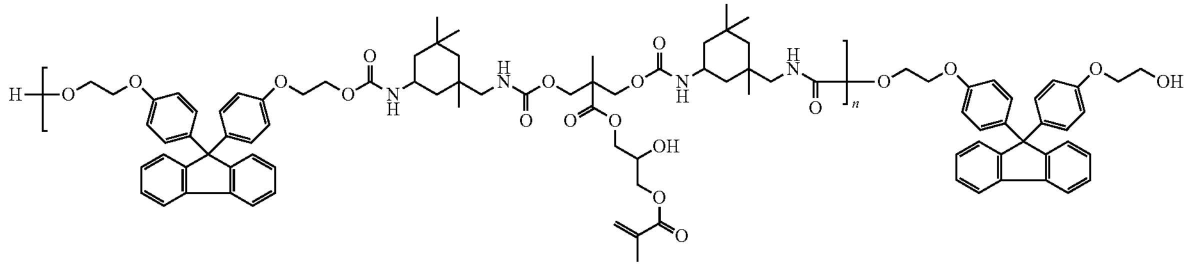

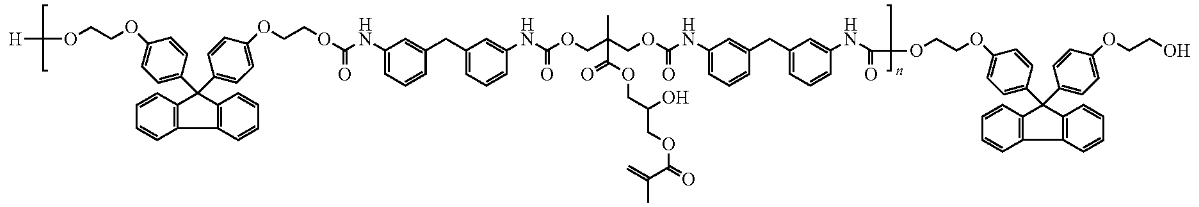

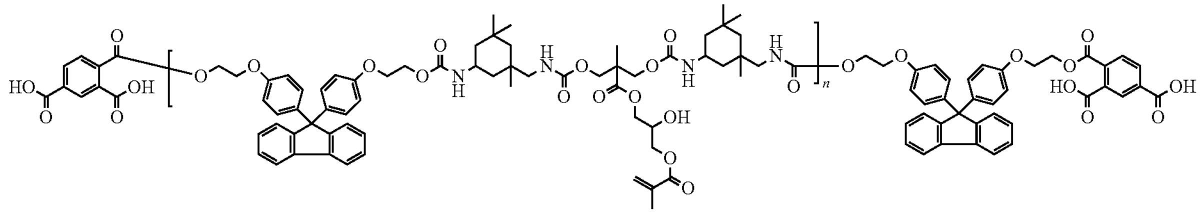

(meth)acrylate, pentaerythritol tetraacrylate, pentaerythritol triacrylate, dipentaerythritol pentaacrylate, dipentaerythritol hexaacrylate, or the like.

In one embodiment of the present specification, nonlimiting examples of the caprolactone-introduced multifunctional monomer may include a case of introducing caprolactone to dipentaerythritol, a case of introducing caprolactone to tetrahydrofuryl acrylate, a case of introducing caprolactone to neopentyl glycol hydroxypivalate, a case of introducing caprolactone to a bisphenol A derivative, a case of introducing caprolactone to a urethane-based multifunctional monomer, or the like.

Specifically, examples of the caprolactone-introduced multifunctional monomer may include KAYARAD DPCA-20, 30, 60, 120 or the like and FA-2D, FA1DT, FA-3 or the like introducing caprolactone to dipentaerythritol, and KAYARAD TC-110S introducing caprolactone to tetrahydrofuryl acrylate, or KAYARAD HX-220, KAYARAD HK-620 or the like introducing caprolactone to neopentyl glycol hydroxypivalate.

In one embodiment of the present specification, as the caprolactone-introduced multifunctional monomer, those introducing caprolactone to epoxy acrylate of other bisphenol A derivatives or to novolac-epoxy acrylate, or those introducing caprolactone to U-324A, U15HA, U-4HA or the like, a urethane-based multifunctional acrylate, may also be used.

In one embodiment of the present specification, the multifunctional monomer having an ethylenically unsaturated double bond may be used either alone, or as a mixture of two or more types.

In one embodiment of the present specification, the multifunctional monomer having an ethylenically unsaturated double bond is preferably included in 1% by weight to 30% by weight with respect to a total weight of the negative-type photosensitive resin composition. The content of 1% by weight or greater is advantageous for photosensitivity or insulating film strength, and the content of 30% by weight or less may prevent adhesion of a coated film from being excessive, and may prevent a decrease in the insulating film strength and a pattern loss during development.

In one embodiment of the present specification, the pigment dispersion includes a black organic pigment.

The black organic pigment means a pigment formed with organic materials, and absorbing light in a visible wavelength band as a single species to express black series colors. By using an organic pigment as the black pigment, target optical density (OD) may be accomplished even with a small amount compared to using existing combined pigments of two or more types or inorganic pigments. The composition according to embodiments of the present specification may include one, two or more types as the black organic pigment.

According to one embodiment, lactam-based pigments or perylene-based pigments may be used as the black organic pigment.

According to one example, the black organic pigment includes a compound of the following Chemical Formula 11 or 12.

[Chemical Formula 11]

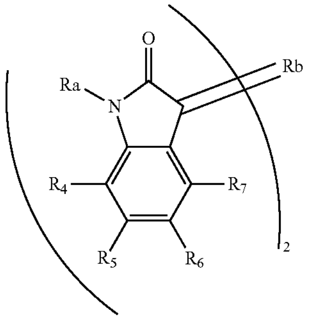

In Chemical Formula 11,

Ra is hydrogen; or a substituted or unsubstituted alkyl group, $R_4$, $R_5$, $R_6$ and $R_7$ are the same as or different from each other, and each independently H, halogen, —$COOR_8$, —$CONR_8R_9$, —$OR_8$, —$OOCR_8$, —$OOCNR_8R_9$, OH, CN, $NO_2$, $NR_8R_9$, —$NR_8COR_9$, —N═$CR_8R_9$, —$SR_8$, —$SOR_8$, —$SO_xR_8$ (x=1 to 3) or —$SO_2NR_8R_9$, or $R_4$ and $R_5$, $R_5$ and $R_6$, or $R_6$ and $R_7$ either directly bond to each other or bond to each other through an O, S or $NR_8$ bridge to form a ring, Rb is a mono or polycyclic group including one of N, O, S, CO and COO, and $R_8$ and $R_9$ are the same as or different from each other, and each independently H, C1-C12 alkyl, C3-C12 cycloalkyl, C2-C12 alkenyl, C3-C12 cycloalkenyl or C2-C12 alkynyl, and at least one of —$CH_2$—, —CH═ and —C≡ forming these is substituted with —COO—, —O—, —$CONR_{10}$—, ═N—, —$NR_{10}$—, —S— or —CO—, or at least one of hydrogens bonding to carbon may be substituted with a halogen group, —$COOR_{10}$, —$CONR_{10}R_{11}$, —$OR_{10}$, —$OOCR_{10}$, —$OOCNR_{10}R_{11}$, OH, CN, $NO_2$, —$NR_{10}COR_{11}$, —N═$CR_{10}R_{11}$, $SR_{10}$, —$SOR_{10}$, —$SOxR_{10}$ (x=1 to 3), —$SO_2NR_{10}R_{10}$ or —$NR_{10}R_{11}$, and herein, $R_{10}$ and $R_{11}$ are each independently C1~C6 alkyl, or a group including O, S or NH.

Descriptions on the substituents of Chemical Formula 11 provided above are only applied to Chemical Formula 11.

[Chemical Formula 12]

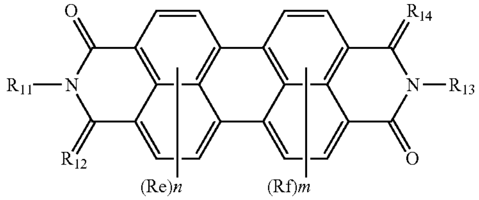

In Chemical Formula 12, $R_{11}$ and $R_{13}$ are the same as or different from each other, and each independently H, C1~C12 alkyl, C3~C12 cycloalkyl, C6~C12 aryl group or C3-C12 heteroaryl group, and at least one of —$CH_2$— and —CH═ forming these is substituted with ═N—, —N═N—, —O—, —CO—, —COO— or —$NR_{15}$—, or at least one of hydrogens bonding to carbon may be substituted with halogen, —$OR_{15}$, CN or $NO_2$, and $R_{15}$ is H, C1~C6 alkyl, C2~C6 alkenyl or phenyl, $R_{12}$ and $R_{14}$ are the same as or different from each other and each independently O or $NR_{16}$, and $R_{16}$ is C1~C12 alkyl or C2~C12 alkenyl, $R_{11}$ and $R_{12}$, or $R_{13}$ and $R_{14}$ may bond to each other to form a ring (cyclic), and Re and Rf are a halogen group, and m and n are each an integer of 0 to 4.

Descriptions on the substituents of Chemical Formula 12 provided above are only applied to Chemical Formula 12.

According to one example, Rb of Chemical Formula 11 may be the following structural formula.

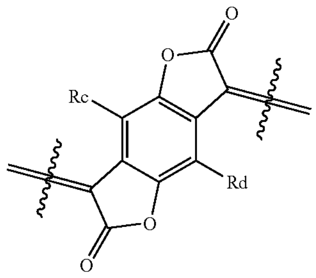

In the structural formula,

Rc and Rd are the same as or different from each other, and each independently H, $CH_3$, $CF_3$, F or Cl.

According to one example, Chemical Formula 11 may be the following structural formula.

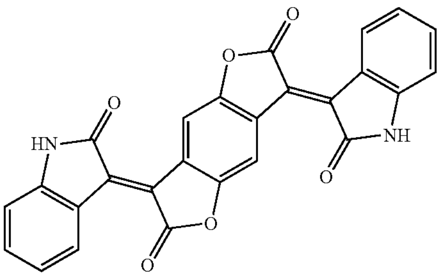 [SMILES: O=C1Nc2ccccc2/C1=C1\C(=O)Oc2cc3c(cc21)OC(=O)/C3=C1/C(=O)Nc2ccccc21]

A representative product of the compound of Chemical Formula 11 may include Pigment IRGAPHOR Bk S0100CF of BASF Corporation, and representative examples of Chemical Formula 12 may include C.I. Pigment Black No. 31, C.I. Pigment Black No. 32 and the like.

According to another embodiment of the present application, the pigment dispersion further includes one or more types of pigments absorbing light having a wavelength of at least a part of 400 nm to 600 nm. Herein, the black organic pigment and the pigment absorbing light having a wavelength of at least a part of 400 nm to 600 nm may have a weight ratio of 100:0 to 90:10.

According to one embodiment, the pigment absorbing light having a wavelength of at least a part of 400 nm to 600 nm may include at least one of yellow series pigments, orange series pigments, brown series pigments and red series pigments. Specifically, the pigment absorbing light having a wavelength of at least a part of 400 nm to 600 nm may include yellow series such as C.I. Pigment Yellow 138, C.I. Pigment Yellow 139, C.I. Pigment Yellow 150, C.I. Pigment Yellow 151, C.I. Pigment Yellow 83, C.I. Pigment Yellow 93 and C.I. Pigment Yellow 110, and C.I. Pigment Red 123, C.I. Pigment Red 149, C.I. Pigment Red 178, C.I. Pigment Red 179, C.I. Pigment Red 224, C.I. Pigment Red 139, C.I. Pigment Red 143, C.I. Pigment Red 166, C.I. Pigment Red 242, C.I. Pigment Red 175, C.I. Pigment Red 176, C.I. Pigment Red 177, C.I. Pigment Red 185, C.I. Pigment Red 208, C.I. Pigment Red 254, C.I. Pigment Red 255, C.I. Pigment Red 264, C.I. Pigment Red 272, C.I. Pigment Orange 36, C.I. Pigment Orange 62, C.I. Pigment Orange 64, C.I. Pigment Orange 72, C.I. Pigment Orange 71, C.I. Pigment Orange 73, C.I. Pigment Brown 23, C.I. Pigment Brown 41, C.I. Pigment Brown 42, and the like.

According to another embodiment of the present application, the pigment dispersion may further include high-resistance carbon black having volume resistance of $10^{11}$ ohm·cm or greater based on the use of 50% by weight content in the coated film. The black organic pigment and the high-resistance carbon black may have a weight ratio of 99.5:0.5 to 90:10.

In another embodiment of the present application, the photoinitiator is a material having a role of generating radicals by light, and it is preferred that one, two or more of types of compounds selected from the group consisting of acetophenone-based compounds, biimidazole-based compounds, triazine-based compounds, and oxime-based compounds are mixed and used.

As the acetophenone-based compound usable as the photoinitiator, those selected from the group consisting of 2-hydroxy-2-methyl-1-phenylpropan-1-one, 1-(4-isopropylphenyl)-2-hydroxy-2-methylpropan-1-one, 4-(2-hydroxyethoxy)-phenyl-(2-hydroxy-2-propyl)ketone, 1-hydroxycyclohexyl phenyl ketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propan-1-one, 2-benzyl-2-dimethylamino-1-(4-morpholinophenyl)-butan-1-one, 2-(4-bromo-benzyl-2-dimethylamino-1-(4-morpholinophenyl)-butan-1-one and 2-methyl-1-[4-(methylthio)phenyl]-2-morpholinopropan-1-one may be used.

As the biimidazole-based compound, those selected from the group consisting of 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole and 2,2'-bis(o-chlorophenyl)-4,4,5,5'-tetraphenyl-1,2'-biimidazole may be used.

As the triazine-based compound, those selected from the group consisting of 3-{4-[2,4-bis(trichloromethyl)-s-triazin-6-yl]phenylthio}propionic acid, 1,1,1,3,3,3-hexafluoroisopropyl-3-{4-[2,4-bis(trichloromethyl)-s-triazin-6-yl]phenylthio}propionate, ethyl-2-{4-[2,4-bis(trichloromethyl)-s-triazin-6-yl]phenylthio}acetate, 2-epoxyethyl-2-{4-[2,4-bis(trichloromethyl)-s-triazin-6-yl]phenylthio}acetate, cyclohexyl-2-{4-[2,4-bis(trichloromethyl)-s-triazin-6-yl]phenylthio}acetate, benzyl-2-{4-[2,4-bis(trichloromethyl)-s-triazin-6-yl]phenylthio}acetate, 3-{chloro-4-[2,4-bis(trichloromethyl)-s-triazin-6-yl]phenylthio}propionic acid, 3-{4-[2,4-bis(trichloromethyl)-s-triazin-6-yl]phenylthio}propionamide, 2,4-bis(trichloromethyl)-6-p-methoxystyryl-s-triazine, 2,4-bis(trichloromethyl)-6-(1-p-dimethylaminophenyl)-1,3-butadienyl-s-triazine and 2-trichloromethyl-4-amino-6-p-methoxystyryl-s-triazine may be used.

As the oxime-based compound, 1,2-octadione-1-(4-phenylthio)phenyl-2-(o-benzoyloxime) (Ciba Specialty Chemicals, CGI 124), ethanone-1-(9-ethyl)-6-(2-methylbenzoyl-3-yl)-1-(o-acetyloxime) (CGI 242), oxime OX-03 (Ciba Specialty Chemicals), NCI-831 (Adeka Corporation), PI-102 (LG Chem.), PBG 304, PBG 305, PBG 3057 (Tronly) and the like may be included.

The photoinitiator is preferably included in 0.5% by weight to 10% by weight with respect to a total weight of the negative-type photosensitive resin composition. More preferably, the photoinitiator may be used in 10 parts by weight to 300 parts by weight (based on the total amount of the photoinitiator used) with respect to 100 parts by weight of the multifunctional monomer having an ethylenically unsaturated double bond. Particularly, the acetophenone-based compound may be used alone in 0.5% by weight to 5% by weight with respect to a total weight of the resin composition, or the oxime-based initiator may also be further mixed in 0.01% by weight to 3% by weight thereto.

As an auxiliary component, the photoinitiator may further include a photocrosslinking sensitizer facilitating radical generation in 0.01% by weight to 5% by weight, or a curing accelerator facilitating curing in 0.01% by weight to 5% by weight, with respect to a total weight of the resin composition.

As the photocrosslinking sensitizer, benzophenone-based compounds such as benzophenone, 4,4-bis(dimethylamino) benzophenone, 4,4-bis(diethylamino)benzophenone, 2,4,6-trimethylaminobenzophenone, methyl-o-benzoyl benzoate, 3,3-dimethyl-4-methoxybenzophenone or 3,3,4,4-tetra(t-butylperoxycarbonyl)benzophenone; fluorenone-based compounds such as 9-fluorenone, 2-chloro-9-fluorenone or 2-methyl-9-fluorenone; thioxanthone-based compounds such as thioxanthone, 2,4-diethyl thioxanthone, 2-chlorothioxanthone, 1-chloro-4-propyloxy thioxanthone, isopropyl thioxanthone or diisopropyl thioxanthone; xanthone-based compounds such as xanthone or 2-methylxanthone; anthraquinone-based compounds such as anthraquinone, 2-methyl anthraquinone, 2-ethyl anthraquinone, t-butyl anthraquinone or 2,6-dichloro-9,10-anthraquinone; acridine-based compounds such as 9-phenylacridine, 1,7-bis(9-acridinyl)heptane, 1,5-bis(9-acridinylpentane) or 1,3-bis(9-acridinyl)propane; dicarbonyl compounds such as benzyl, 1,7,7-trimethyl-bicyclo[2,2,1]heptane-2,3-dione or 9,10-phenanthrenequinone; phosphine oxide-based compounds such as 2,4,6-trimethylbenzoyl diphenylphosphine oxide or bis(2,6-dimethoxybenzoyl)-2,4,4-trimethylpentyl phosphine oxide; benzophenone-based compounds such as methyl-4-(dimethylamino)benzoate, ethyl-4-(dimethylamino)benzoate or 2-n-butoxyethyl-4-(dimethylamino)benzoate; amino synergists such as 2,5-bis(4-diethylaminobenzal)cyclopentanone, 2,6-bis(4-diethylaminobenzal)cyclohexanone or 2,6-bis(4-diethylaminobenzal)-4-methyl-cyclopentanone; coumarin-based compounds such as 3,3-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin or 10,10-carbonylbis[1,1,7,7-tetramethyl-2,3,6,7-tetrahydro-1H,5H,11H—C1]-benzopyrano[6,7,8-ij]-quinolizin-11-one; chalcone-based compounds such as 4-diethylaminochalcone or 4-azidebenzalacetophenone; 2-benzoylmethylene, 3-methyl-b-naphthothiazoline, or the like may be used.

In addition, as the curing accelerator, 2-mercaptobenzimidazole, 2-mercaptobenzothiazole, 2-mercaptobenzoxazole, 2,5-dimercapto-1,3,4-thiadiazole, 2-mercapto-4,6-dimethylaminopyridine, pentaerythritol-tetrakis(3-mercaptopropionate), pentaerythritol-tris(3-mercaptopropionate), pentaerythritol-tetrakis(2-mercaptoacetate), pentaerythritol-tris(2-mercaptoacetate), trimethylolpropane-tris(2-mercaptoacetate), trimethylolpropane-tris(3-mercaptopropionate) or the like may be used.

In another embodiment of the present application, the solvent may include, when considering solubility, pigment dispersability, coatability and the like, propylene glycol monomethyl ether, ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, 2-hydroxyethyl propionate, 3-methyl-3-methoxybutyl propionate, ethyl-3-methoxypropionate, methyl-3-ethoxypropionate, ethyl-3-ethoxypropionate, butyl acetate, amyl formate, isoamyl acetate, isobutyl acetate, butyl propionate, isopropyl butyrate, ethyl butyrate, butyl butyrate, ethyl pyruvate, γ-butyrol acetate or the like. The solvent may be used either alone, or as a mixture of two or more types.

The negative-type photosensitive resin composition according to the embodiments described above may further include additives as long as they do not adversely affect goals of the present disclosure. For example, one or more types of additives selected from the group consisting of a dispersant, an adhesion promoter, an antioxidant, an ultraviolet absorber, a thermal polymerization inhibitor and a leveling agent may be further used.

The dispersant may be used using a method of internally adding to the pigment in the form of surface treating the pigment in advance, or a method of externally adding to the pigment. As the dispersant, polymer-type, nonionic, anionic or cationic dispersants may be used. Nonlimiting examples of such a dispersant may include polyalkylene glycol and esters thereof, polyoxyalkylene polyhydric alcohols, ester alkylene oxide adducts, alcohol alkylene oxide adducts, sulfonic acid esters, sulfonic acid salts, carboxylic acid esters, carboxylic acid salts, alkylamide alkylene oxide adducts, alkylamines or the like. These may be added either alone, or as a combination of two or more thereof.

Nonlimiting examples of the adhesion promoter may include vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxysilane, 3-aminopropyltriethoxysilane, 3-glycidoxypropyltriethoxysilane, 3-glycidoxypropylmethyldimethoxysilane, 2-(3,4-ethoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane or the like.

Nonlimiting examples of the antioxidant may include 2,2-thiobis(4-methyl-6-t-butylphenol), 2,6-g,t-butylphenol or the like, and nonlimiting examples of the ultraviolet absorber may include 2-(3-t-butyl-5-methyl-2-hydroxyphenyl)-5-chloro-benzotriazole, alkoxybenzophenone or the like. In addition, nonlimiting examples of the thermal polymerization inhibitor may include hydroquinone, p-methoxyphenol, di-t-butyl-p-cresol, pyrogallol, t-butylcatechol, benzoquinone, 4,4-thiobis(3-methyl-6-t-butylphenol), 2,2-methylenebis(4-methyl-6-t-butylphenol), 2-mercaptoimidazole or the like.

The negative-type photosensitive resin composition provided in one embodiment of the present specification includes, based on 100 parts by weight of the negative-type photosensitive resin composition, the binder resin in 10 parts by weight to 30 parts by weight; the pigment dispersion in 10 parts by weight to 35 parts by weight; the multifunctional monomer in 1 parts by weight to 30 parts by weight; the photoinitiator in 0.5 parts by weight to 10 parts by weight; and the solvent in 30 parts by weight to 70 parts by weight.

When each of the constituents included in the negative-type photosensitive resin composition satisfies the content range described above, coatability of the negative-type photosensitive resin composition is enhanced, and a black bank with a uniform thickness may be prepared.

The negative-type photosensitive resin composition according to the embodiments described above may be prepared by mixing the components described above.

According to one example, the pigment dispersion is prepared first. By using a pigment commercially available in a dispersion form, the pigment dispersion preparation may be replaced. The binder resin is mixed to the pigment dispersion, the multifunctional monomer, the photoinitiator and the solvent are added thereto, and the result is stirred to prepare the negative-type photosensitive resin composition.

Since the photosensitive resin composition according to the embodiments described above is a negative-type, materials with no pattern residue while having high ultraviolet sensitivity may be used. According to one example, the resin composition has volume resistance of $10^{12}$ ohm·cm or greater when forming a coated film with a thickness of 2 μm, and may have a dielectric constant of 3 to 6. According to another example, light transmittance at 380 nm to 600 nm is less than 1% when forming a coated film with a thickness of 2 μm, and optical density (OD) may be 1/μm or greater.

One embodiment of the present specification provides a black bank formed using the negative-type resin composition.

One embodiment of the present specification provides a display apparatus including the black bank.

FIG. 1 is a mimetic diagram of the display apparatus including the black bank according to the present disclosure.

One example of a method for forming the black bank is as follows.

The negative-type photosensitive resin composition described above is coated on a substrate surface, and the solvent is removed by pre-bake to form a film. As the coating method, methods such as a spray method, a roll coating method, a spin coating method, a bar coating method, a slit coating method and the like may be used. The prebake condition varies depending on the mixing components and ratio of the composition, however, the prebake may be normally conducted for 0.5 minutes to 30 minutes at 70° C. to 150° C.

Next, a pattern is formed by irradiating radiation such as ultraviolet rays on the prebaked coated film through a predetermined pattern mask, and developing the film using an aqueous alkali solution to remove unnecessary parts. Herein, a dipping method, a shower method and the like may be used without limit as the development method. The developing time is normally approximately from 30 seconds to 180 seconds. As the developing solution, inorganic alkalis such as sodium hydroxide, potassium hydroxide, sodium silicate, sodium metasilicate or ammonia as an aqueous alkali solution; primary amines such as ethylamine or N-propylamine; secondary amines such as diethylamine or di-n-propylamine; tertiary amines such as trimethylamine, methyldiethylamine or dimethylethylamine; tertiary alcohol amines such as dimethylethanolamine, methyldiethanolamine or triethanolamine; cyclic tertiary amines such as pyrrole, piperidine, n-methyl piperidine, n-methyl pyrrolidine, 1,8-diazabicyclo[5.4.0]-7-undecene, 1,5-diazabicyclo [4.3.0]-5-nonene; aromatic tertiary amines such as pyridine, collidine, lutidine or quinoline; an aqueous solution of quaternary ammonium salt such as tetramethylammonium hydroxide or tetraethylammonium hydroxide, and the like may be used.

After the development, the result is water washed for approximately 30 seconds to 90 seconds, and dried using air or nitrogen to form a pattern. Through post-baking this pattern using a heating device such as a hot plate or an oven, a complete black bank may be obtained. Herein, as a condition of the post-bake, heating for approximately 10 minutes to 90 minutes at 150° C. to 230° C. is preferred.

The completed black bank has volume resistance of $10^{12}$ ohm·cm or greater, a dielectric constant of 3 to 6, and optical density (OD) of 1/μm to 2/μm.

A method for manufacturing the display apparatus including an organic light emitting device according to one embodiment is not particularly limited, however, the manufacturing method may be as follows.

On a transparent substrate such as glass, a transparent electrode such as indium tin oxide (ITO) is deposited by sputtering, and after going through processes such as PR coating, exposure, development, etching and PR removal to form a patterned transparent electrode, the black bank is formed using the negative-type photosensitive resin composition described above.

For example, the above-described negative-type photosensitive resin composition is coated on an electrode-formed substrate to form a coated film, and after exposing the film using a photomask and the like and radiation including ultraviolet rays, the exposed substrate is developed, washed, and dried for patterning. Then, a partition wall for distinguishing each pixel may be formed on the formed black bank.

After that, an organic thin film is deposited in a single layer or a multilayer. The organic thin film includes a light emitting layer, and as necessary, may further include other layers for charge transfer or charge blocking such as an electron injection layer, an electron transfer layer, a hole blocking layer, a hole transfer layer, a hole injection layer and/or an electron blocking layer. Next, a metal electrode layer is deposited. Then, a hollow-structured SUS can and the substrate are encapsulated (sealed) with an encapsulant (sealing agent) such as an epoxy resin, and assembled into a module to manufacture a display apparatus including an organic light emitting device.

As in FIG. 2, the display apparatus includes a color pattern (a), an overcoating layer (b) provided on the color pattern, and a black bank provided on the overcoating layer, and a thickness difference in the black bank may be from 0.5 μm to 2 μm. The display apparatus may further include a white pixel (d) without a color pattern layer. In this case, uniformity in the thickness of the black bank may be maintained. Specifically, the black bank thickness (f1) on the laminated portion of the color filter pixels and the overcoat layer may be from 0.5 μm to 2 μm, and the black bank thickness (f2) on the flat portion of the color filter pixel and the overcoat layer and the black bank thickness (f3) formed on the white pixel may each be from 1 μm to 3 μm, and f3-f1 may be from 0.5 μm to 2 μm.

Specifically, a structure having the black bank formed is illustrated in FIG. 2. As illustrated in FIG. 2, a lower substrate in which the black bank is used already has a color filter (a), an overcoat layer (b), a metal electrode (c), a metal line (e) and the like laminated therein. According to one example, the metal line (e) may perform a role of a gate of a thin film transistor (TFT). Herein, when examining a current flow direction in the lamination structure of FIG. 1, a current is applied through the metal line (e), a gate of a thin film transistor (TFT), goes through the metal electrode (c) performing a role of an anode, and flows out of an organic light emitting layer and a cathode. For example, the color filter may be commonly formed to a thickness of 2 μm to 2.5 μm, the overcoat layer to a thickness of 1 μm to 3 μm, and the metal electrode to a thickness of 500 angstroms to 2,000 angstroms. In FIG. 2, b1 is a thickness of the overcoat layer on the flat portion of the color filter pixel, and b2 is a thickness of the overcoat layer on the laminated portion of the color filter pixels.

Particularly, a white pixel (d) may be added for the purpose of improving transmittance. In FIG. 2, f1 is a thickness of the black bank on the laminated portion of color filter pixels and the overcoat layer, f2 is a thickness of the black bank on the flat portion of the color filter pixel and the overcoat layer, and f3 is a thickness of the black bank formed on the white pixel. There is a significant difference between the thickness (f1) of the black bank in the laminated portion where each color layer meets and the thickness (f3) of the black bank on the white pixel portion filled with the overcoat layer.

There is a severe surface curvature due to the difference in the thickness of the laminated structure of the black bank-applied substrate, and this causes the composition to flow in the color laminated portion having a high curvature when forming a coated film using the resin composition for a black bank making it difficult to form a black bank with a constant height. However, by using the compound of Chemical Formula 1 in the present disclosure, the negative-type photosensitive resin composition has improved flow properties, and even when coating the photosensitive resin composition on a high curve portion of the surface with a severe surface curvature, the composition does not flow, and a black bank with a constant thickness may be formed.

FIG. 3 shows scanning electron microscope (SEM) images of the surface of the coated film formed using the negative-type photosensitive resin composition according examples and comparative examples depending on the developing time. The coated film thicknesses in Examples 1 to 3 are from 1.5 μm to 1.6 μm, and even when the developing time increases, the coated film thickness is not reduced, or the pattern is not lost. In Comparative Example 1, the coated film thickness is reduced as the developing time passes, and in Comparative Example 2, the pattern is lost as the developing time passes. As a result, it may be identified that, by using the binder resin including the compound of Chemical Formula 1 according to the present specification in the negative-type photosensitive resin composition, film properties are enhanced due to an increase in the crosslinking sites of the binder resin, and excellent development resistance is obtained.

In one embodiment of the present specification, the negative-type photosensitive resin composition further includes a surfactant.

As the surfactant, fluorine-based or silicone-based surfactants may be used. Specifically, silicone-based surfactants may be used as the surfactant. The surfactant may be included in 0.1 parts by weight to 10 parts by weight based on 100 parts by weight of the negative-type photosensitive resin composition.

In an existing negative-type resin composition, a fluorine-based or silicone-based surfactant is used in 500 ppm or greater. According to an embodiment of the present application, a fluorine-based or silicone-based surfactant may be used in greater than or equal to 50 ppm and less than or equal to 450 ppm. In this case, a surface leveling effect is controlled even when the lower coating substrate has a severe curvature, and a thickness of certain level or higher may be formed on the curvature. When using the surfactant in less than 50 ppm, there is almost no effect of flattening the surface even when the black bank thickness (f1) is formed on the laminated portion of the color filter, which may lead to surface defects, and beads may be formed thick at the edge of the coating substrate causing problems in subsequent processes. When using the surfactant in greater than 450 ppm, the flattening effect is too high, which is disadvantageous in forming the black bank thickness (f1) on the laminated portion of the color filter. In another embodiment of the present application, a copolymer formed by copolymerizing a monomer including an acid group (acid functional group) and a monomer copolymerizable with this monomer may be used as the alkali-soluble resin binder. When copolymerizing as above, film strength may be enhanced compared to resins prepared by homopolymerization. Alternatively, polymer compounds prepared by a polymer reaction between the copolymer formed above and an ethylenically unsaturated compound containing an epoxy group may also be used. In addition, polymer compounds formed by an ethylenically unsaturated compound containing an epoxy group bonding to the copolymer structure may also be used therewith.

Nonlimiting examples of the monomer including an acid group may include (meth)acrylic acid, crotonic acid, itaconic acid, maleic acid, fumaric acid, monomethyl maleic acid, isoprene sulfonic acid, styrene sulfonic acid, 5-norbornene-2-carboxylic acid, and the like. These may be used either alone or as a mixture of two or more types.

Nonlimiting examples of the monomer copolymerizable with the monomer including an acid group may include styrene, chlorostyrene, α-methyl styrene, vinyl toluene, 2-ethylhexyl (meth)acrylate, methyl (meth)acrylate, ethyl (meth)acrylate, butyl (meth)acrylate, benzyl (meth)acrylate, dimethylaminoethyl (meth)acrylate, isobutyl (meth)acrylate, t-butyl (meth)acrylate, cyclohexyl (meth)acrylate, dicyclopentanyl (meth)acrylate, isobornyl (meth)acrylate, 2-phenoxyethyl (meth)acrylate, tetrahydrofurfuryl (meth) acrylate, hydroxyethyl (meth)acrylate, 2-hydroxyethyl (meth)acrylate, 2-hydroxypropyl (meth)acrylate, 2-hydroxy-3-chloropropyl (meth)acrylate, 2-hydroxybutyl (meth)acrylate, 4-hydroxybutyl (meth)acrylate, dimethylaminomethyl (meth)acrylate, diethylamino (meth)acrylate, acyloctyloxy-2-hydroxypropyl (meth)acrylate, ethylhexyl acrylate, 2-methoxyethyl (meth)acrylate, 3-methoxybutyl (meth)acrylate, butoxyethyl (meth)acrylate, ethoxydiethylene glycol (meth)acrylate, methoxytriethylene glycol (meth) acrylate, methoxytripropylene glycol (meth)acrylate, methoxypolyethylene glycol (meth)acrylate, phenoxydiethylene glycol (meth)acrylate, p-nonylphenoxypolyethylene glycol (meth)acrylate, p-nonylphenoxypolypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, β-(meth)acyloloxyethyl hydrogen succinate, methyl α-hydroxymethyl acrylate, ethyl α-hydroxymethyl acrylate, propyl α-hydroxymethyl acrylate, butyl α-hydroxymethyl acrylate, N-phenylmaleimide, N-(4-chlorophenyl)maleimide and the like. These may be used either alone or as a mixture of two or more types.

In addition, nonlimiting examples of the ethylenically unsaturated compound containing an epoxy group capable of going through the polymer reaction with the copolymer of the monomer including an acid group (acid functional group) and the monomer copolymerizable with this monomer may include glycidyl (meth)acrylate, vinylbenzyl glycidyl ether, vinyl glycidyl ether, allyl glycidyl ether, 4-methyl-4,5-epoxypentene, γ-glycidoxypropyl trimethoxysilane, γ-glycidoxypropylmethyl diethoxysilane, γ-glycidoxypropyl triethoxysilane, norbornyl derivatives and the like. These may be used either alone or as a mixture of two or more types.

EXAMPLES

Hereinafter, preferred examples will be provided in order to illuminate the present disclosure. However, the following examples are for illustrative purposes only, and the scope of the present disclosure is not limited to the following examples.

Preparation Example

Preparation of Binder Resin A1

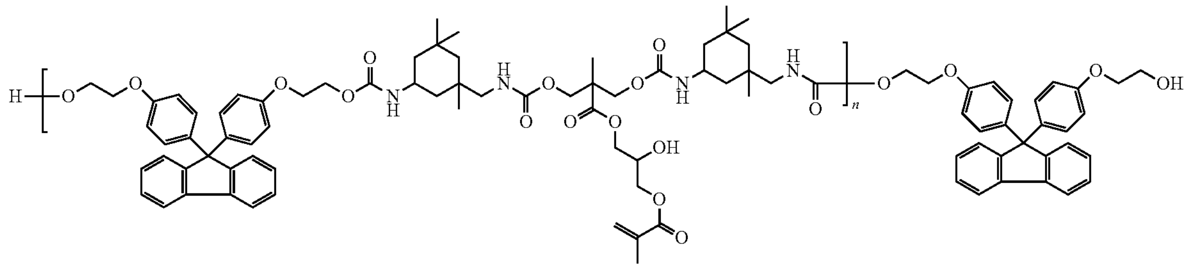

In a 250 ml round bottom flask, 42.88 g of BPEF (9,9-bis(4-(2-hydroxyethoxy)phenyl)fluorine), a cardo-based dialcohol monomer, 7.06 g of BisMPA (2,2-bis(hydroxymethyl)propionic acid), 100.31 g of a diluted solution (solvent propylene glycol methyl ether acetate (PGMEA) 20 wt %) of isophorone diisocyanate (IPDI), a diisocyanate monomer, and 0.70 g of a triphenylphosphine (TPP) catalyst were introduced, and after introducing 49.75 g of propylene glycol methyl ether acetate (PGMEA) thereto, the mixture was well-stirred. The temperature was raised to 125° C. under the nitrogen atmosphere, and the mixture was reacted for 24 hours including the time of raising the temperature. After that, 3.85 g of a glycidyl methacrylate (GMA) monomer and 9.09 g of propylene glycol methyl ether acetate (PGMEA) were introduced thereto, and the result was reacted overnight at the same temperature to prepare Binder Resin A1.

A weight average molecular weight (Mw) of the collected polymer was identified using gel permeation chromatography (GPC), which was 2800 g/mol.

Preparation of Binder Resin A2

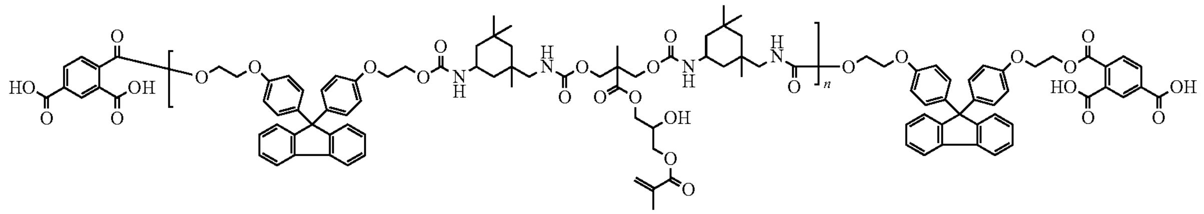

In a 250 ml round bottom flask, 42.88 g of BPEF (9,9-bis(4-(2-hydroxyethoxy)phenyl)fluorine), a cardo-based dialcohol monomer, 7.06 g of BisMPA (2,2-bis(hydroxymethyl)propionic acid), 100.31 g of a diluted solution (solvent propylene glycol methyl ether acetate (PGMEA) 20 wt %) of isophorone diisocyanate (IPDI), a diisocyanate monomer, and 0.70 g of a triphenylphosphine (TPP) catalyst were introduced, and after introducing 49.75 g of propylene glycol methyl ether acetate (PGMEA) thereto, the mixture was well-stirred. The temperature was raised to 125° C. under the nitrogen atmosphere, and the mixture was reacted for 24 hours including the time of raising the temperature. After that, 3.85 g of a glycidyl methacrylate (GMA) monomer and 9.09 g of propylene glycol methyl ether acetate (PGMEA) were introduced thereto, and the result was reacted overnight at the same temperature and then cooled to room temperature. 5.55 g of a trimellitic anhydride (TMA) monomer and 11.11 g of PGMEA were introduced thereto, the temperature was raised to 125° C., and the result was reacted overnight to prepare Binder Resin A2.

A weight average molecular weight (Mw) of the collected polymer was identified using gel permeation chromatography (GPC), which was 2500 g/mol.

Preparation of Binder Resin A3

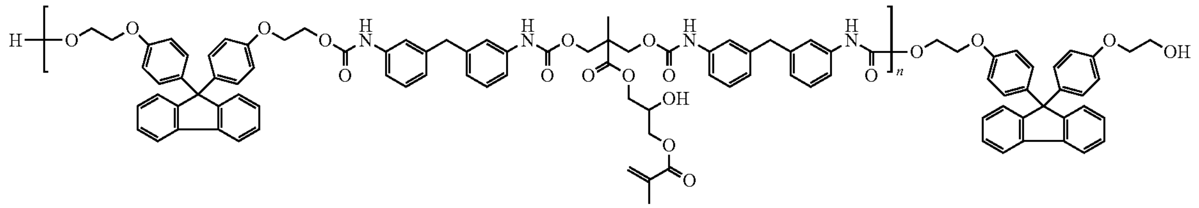

In a 250 ml round bottom flask, 42.88 g of BPEF (9,9-bis(4-(2-hydroxyethoxy)phenyl)fluorine), a cardo-based dialcohol monomer, 7.06 g of BisMPA (2,2-bis(hydroxymethyl)propionic acid), 18.83 g of 3,3'-methylenedianiline and 0.70 g of a triphenylphosphine (TPP) catalyst were introduced, and after introducing 49.75 g of propylene glycol methyl ether acetate (PGMEA) thereto, the mixture was well-stirred. The temperature was raised to 125° C. under the nitrogen atmosphere, and the mixture was reacted for 24 hours including the time of raising the temperature. After that, 3.85 g of a glycidyl methacrylate (GMA) monomer and 9.09 g of propylene glycol methyl ether acetate (PGMEA) were introduced thereto, and the result was reacted overnight at the same temperature to prepare Binder Resin A3.

A weight average molecular weight (Mw) of the collected polymer was identified using gel permeation chromatography (GPC), which was 4300 g/mol.

Preparation of Binder Resin R1

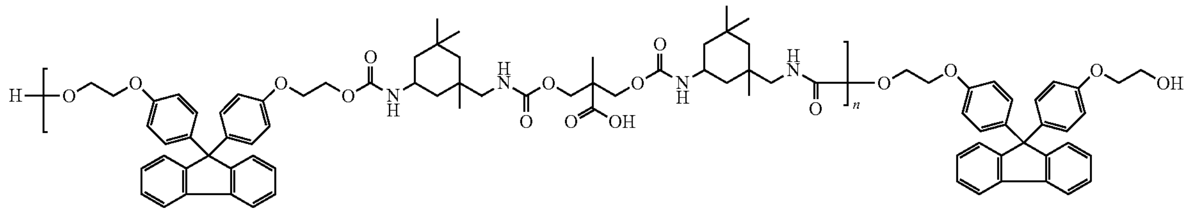

In a 250 ml round bottom flask, 42.88 g of BPEF (9,9-bis(4-(2-hydroxyethoxy)phenyl)fluorine), a cardo-based dialcohol monomer, 7.06 g of BisMPA (2,2-bis(hydroxymethyl)propionic acid), 100.31 g of a diluted solution (solvent propylene glycol methyl ether acetate (PGMEA) 20 wt %) of isophorone diisocyanate (IPDI), a diisocyanate monomer, and 0.70 g of a triphenylphosphine (TPP) catalyst were introduced, and after introducing 49.75 g of propylene glycol methyl ether acetate (PGMEA) thereto, the mixture was well-stirred. The temperature was raised to 125° C. under the nitrogen atmosphere, and the mixture was reacted for 24 hours including the time of raising the temperature to prepare Binder Resin R1.

A weight average molecular weight (Mw) of the collected polymer was identified using gel permeation chromatography (GPC), which was 2600 g/mol.

Preparation of Binder Resin R2

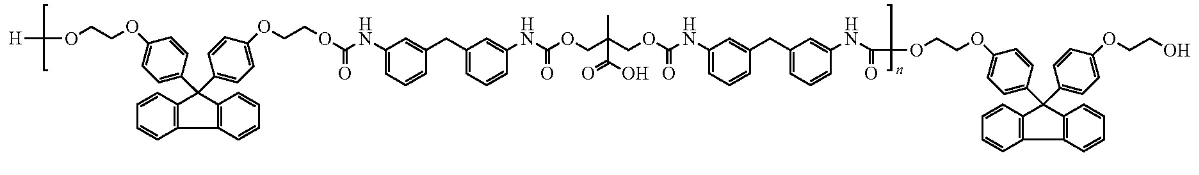

In a 250 ml round bottom flask, 42.88 g of BPEF (9,9-bis(4-(2-hydroxyethoxy)phenyl)fluorine), a cardo-based dialcohol monomer, 7.06 g of BisMPA (2,2-bis(hydroxymethyl)propionic acid), 18.83 g of 3,3'-methylenedianiline and 0.70 g of a triphenylphosphine (TPP) catalyst were introduced, and after introducing 49.75 g of propylene glycol methyl ether acetate (PGMEA) thereto, the mixture was well-stirred. The temperature was raised to 125° C. under the nitrogen atmosphere, and the mixture was reacted for 24 hours including the time of raising the temperature to prepare Binder Resin R2.

A weight average molecular weight (Mw) of the collected polymer was identified using gel permeation chromatography (GPC), which was 4000 g/mol.

Example and Comparative Example

A negative-type photosensitive resin composition was prepared using components described in the following Table 1. Specifically, the composition was prepared including, based on 100 parts by weight of the negative-type photosensitive resin composition, parts by weight of each component described in the following Table 1 and 30 parts by weight of a solvent.

The prepared negative-type photosensitive resin composition was cured under the following condition, and evaluated. The results are described in the following Table 1.

After spin coating, soft bake was conducted, and after conducting exposure using an exposure device, development was conducted using a developing solution (2.38 wt % TMAH sol.), and then post bake was conducted.

Condition of resist evaluation: SOB (soft bake) 100° C./120 s, PB (post bake) 230° C./30 m, thickness 0.5 μm to 2.0 μm, exposure: 70 mJ/cm$^2$ projection, development: 23° C., 2.38 wt % tetramethyl ammonium hydroxide solution (TMAH solution), puddle, DI water rinse

[Residue]

No Residue (◎): no residue or one or less residue in the screen when observing with a scanning electron microscope (SEM) (no residue), Low (○): 2 or more and 5 or less (low), Moderate (Δ): 5 or more but only fine residues present (moderate), High (X): 5 or more fine residues and large residue present

[Evaluation of Thickness Reduction]

Thickness reduced (○): thickness reduced when further developing for 20 seconds compared to existing developing time when observing using a scanning electron microscope (SEM)

Thickness maintained (X): thickness not reduced when further developing for 20 seconds compared to existing developing time when observing using a scanning electron microscope (SEM)

[Evaluation of Pattern Loss]

Pattern lost (○): pattern lost when further developing for 20 seconds compared to existing developing time when observing using a scanning electron microscope (SEM)

Pattern maintained (X): pattern not lost when further developing for 20 seconds compared to existing developing time when observing using a scanning electron microscope (SEM)

TABLE 1

| | Pigment Dispersion (Parts by Weight) | Binder Resin (Parts by Weight) | Multifunctional Monomer (Parts by Weight) | Photo-initiator (Parts by Weight) | Surfactant (Parts by Weight) | Residue | Thickness Reduction | Pattern Loss |
|---|---|---|---|---|---|---|---|---|
| Example 1 | 30 | A1 (30) | 5.0 | 5.0 | 1.0 | ○ | X | X |
| Example 2 | 30 | A2 (30) | 5.0 | 5.0 | 1.0 | ◎ | X | X |
| Example 3 | 30 | A3 (30) | 5.0 | 5.0 | 1.0 | ○ | X | X |
| Comparative Example 1 | 30 | R1 (30) | 5.0 | 5.0 | 1.0 | ○ | ○ | X |
| Comparative Example 2 | 30 | R2 (30) | 5.0 | 5.0 | 1.0 | Δ | ○ | ○ |

Pigment dispersion: including pigment Lactam black (BASF Corporation) in 30% by weight (solvent propylene glycol monomethyl ether acetate) based on total weight of pigment dispersion Multifunctional monomer: V-802 (Osaka Organic Chemical Industry Ltd.)

Photoinitiator: OXE-03 (BASF Corporation)

Surfactant: silicone-based surfactant BYK-307

According to Table 1, it was identified that Examples 1 to 3 had less residues compared to Comparative Examples 1 and 2, and there were no thickness reduction and no pattern loss. As a result, it was identified that the binder resin including the compound of Chemical Formula 1 according to the present specification, and the negative-type photosensitive resin composition including the binder resin had superior development resistance, and had enhanced film properties by having superior crosslinking properties.

The invention claimed is:

1. A compound of the following Chemical Formula 1:

[Chemical Formula 1]

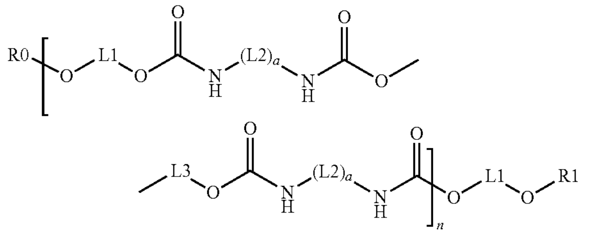

wherein, in the Chemical Formula 1,

R0 and R1 are the same as or different from each other, and each independently hydrogen; or —(C═O) R';

R' is a substituted or unsubstituted aryl group;

L2s are the same as or different from each other and each independently is a substituted or unsubstituted alkylene group; a substituted or unsubstituted cycloalkylene group; or a substituted or unsubstituted arylene group;

a is 2 or 3;

n is an integer of 1 to 10;

L1 and L3 are the same as or different from each other, and each independently include at least one of linking groups of the following Chemical Formulae 2 and 4; and at least one of L1 and L3 is a linking group represented by the Chemical Formula 4,

[Chemical Formula 2]

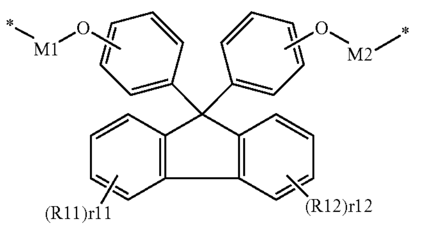

[Chemical Formula 4]

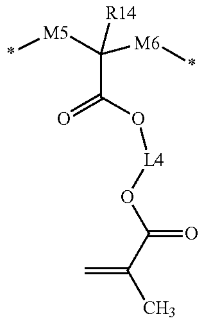

in the Chemical Formulae 2 and 4, means a part linked to Chemical Formula 1;

M1, M2, M5, M6 and L4 are the same as or different from each other, and each independently a substituted or unsubstituted alkylene group;

R11, R12 and R14 are the same as or different from each other, and each independently hydrogen; or a substituted or unsubstituted alkyl group; and r11 and r12 are each an integer of 0 to 4, and when r11 is 2 or greater, R11s are the same as or different from each other, and when r12 is 2 or greater, R12s are the same as or different from each other.

2. The compound of claim 1, wherein (L2)a in the Chemical Formula 1 is the following Chemical Formula 5 or 6:

[Chemical Formula 5]

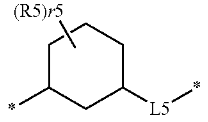

-continued

[Chemical Formula 6]

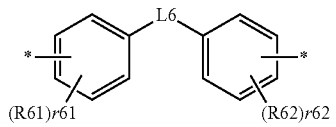

in the Chemical Formulae 5 and 6,

means a part linked to the Chemical Formula 1;

L5 and L6 are the same as or different from each other, and each independently a substituted or unsubstituted alkylene group;

R5, R61 and R62 are the same as or different from each other, and each independently hydrogen; or a substituted or unsubstituted alkyl group;

r5 is an integer of 0 to 10, and when r5 is 2 or greater, R5s are the same as or different from each other;

r61 is an integer of 0 to 4, and when r61 is 2 or greater, R61s are the same as or different from each other; and r62 is an integer of 0 to 4, and when r62 is 2 or greater, R62s are the same as or different from each other.

3. The compound of claim 1, wherein L1 in the Chemical Formula 1 is the linking group of Chemical Formula 2, and L3 in the formula 1 is the linking group of Chemical Formula 4.

4. The compound of claim 1, wherein M1, M2, M5 and M6 in the Chemical Formulae 2 and 4 are the same as or different from each other, and each independently a substituted or unsubstituted methylene group.

5. The compound of claim 1, wherein L4 in the Chemical Formula 4 is a propylene group substituted with a hydroxyl group.

6. A binder resin comprising the compound of claim 1.

7. The binder resin of claim 6, wherein the binder resin has a weight average molecular weight of 2,000 g/mol to 10,000 g/mol.

8. A negative-type photosensitive resin composition comprising:

the binder resin of claim 6;

a pigment dispersion:

a multifunctional monomer;

a photoinitiator; and a solvent.

9. The negative-type photosensitive resin composition of claim 8, further comprising a surfactant.

10. The negative-type photosensitive resin composition of claim 8, wherein the pigment dispersion includes a black organic pigment.

11. The negative-type photosensitive resin composition of claim 8, comprising:

the binder resin in 10 parts by weight to 30 parts by weight;

the pigment dispersion in 10 parts by weight to 35 parts by weight;

the multifunctional monomer in 1 parts by weight to 30 parts by weight;

the photoinitiator in 0.5 parts by weight to 10 parts by weight; and the solvent in 30 parts by weight to 70 parts by weight, based on 100 parts by weight of the negative-type photosensitive resin composition.

12. A black bank formed from the negative-type photosensitive resin composition of claim 8.

13. A display apparatus comprising the black bank of claim 12.

* * * * *